(12) United States Patent
Flynn et al.

(10) Patent No.: US 7,713,068 B2
(45) Date of Patent: May 11, 2010

(54) APPARATUS, SYSTEM, AND METHOD FOR A SCALABLE, COMPOSITE, RECONFIGURABLE BACKPLANE

(75) Inventors: David Flynn, Sandy, UT (US); Alan Hayes, Salt Lake City, UT (US); Bert Lagerstedt, Pleasant Grove, UT (US); John Strasser, Syracuse, UT (US); Jonathan Thatcher, Lehi, UT (US); Vince Warner, Alpine, UT (US)

(73) Assignee: Fusion Multisystems, Inc., Salt Lake City, UT (US)

( * ) Notice: Subject to any disclaimer, the term of this patent is extended or adjusted under 35 U.S.C. 154(b) by 227 days.

(21) Appl. No.: 11/952,118

(22) Filed: Dec. 6, 2007

(65) Prior Publication Data

US 2008/0225474 A1     Sep. 18, 2008

Related U.S. Application Data

(60) Provisional application No. 60/873,111, filed on Dec. 6, 2006.

(51) Int. Cl.
*H01R 12/00* (2006.01)
*H05K 1/00* (2006.01)

(52) U.S. Cl. .......................... 439/65; 361/788

(58) Field of Classification Search ................. 439/65, 439/66, 61, 62, 64; 361/788, 695, 697, 796, 361/798
See application file for complete search history.

(56) References Cited

U.S. PATENT DOCUMENTS 6,824,393 B2 * 11/2004 Debord et al. ................ 439/65

| 6,932,617 B2 * | 8/2005 | Debord et al. ................ 439/65 |
| 2002/0182899 A1 | 12/2002 | Debord et al. |
| 2003/0033361 A1 | 2/2003 | Garnett et al. |
| 2004/0150964 A1 | 8/2004 | Uzuka et al. |
| 2005/0042893 A1 | 2/2005 | Debord et al. |
| 2008/0137284 A1 * | 6/2008 | Flynn et al. ................ 361/685 |

OTHER PUBLICATIONS

PCT/US2007/086704, International Search Report and Written Opinion, Sep. 29, 2008.
PCT/US2007/086704, International Preliminary Report on Patentability, Jun. 18, 2009.

* cited by examiner

*Primary Examiner*—Javaid Nasri
(74) *Attorney, Agent, or Firm*—Kunzler Needham Massey & Thorpe

(57) ABSTRACT

An apparatus, system, and method are disclosed for a scalable, composite, reconfigurable backplane. The backplane is made up of one or more blade aggregation modules which provide switching for attached devices. The blade aggregation module connects to transition cards that then connect with blade modules. The blade aggregation module provides connectivity to the connected modules, which may connect to a second blade aggregation module through the transition cards. The transition cards may additionally connect with unit aggregation modules to connect rows of blade modules together. Transition cards can also provide outside connectivity. The backplane, made up of blade aggregation modules, transition cards, and unit aggregation modules, is highly scalable and versatile, and also provides an unblocked airflow path to facilitate cooling the blades.

25 Claims, 12 Drawing Sheets

APPARATUS, SYSTEM, AND METHOD FOR A SCALABLE, COMPOSITE, RECONFIGURABLE BACKPLANE

CROSS-REFERENCES TO RELATED APPLICATIONS

This application claims priority to U.S. Provisional Patent Application No. 60/873,111 entitled "Elemental Blade System" and filed on Dec. 6, 2006 for David Flynn, et al. which is incorporated herein by reference.

BACKGROUND OF THE INVENTION

1. Field of the Invention

This invention relates to blade server systems and more particularly relates to a backplane of a blade server system.

2. Description of the Related Art

Blade computing is growing in popularity in the information technology ("IT") realm. As more and more services are offered via computers and computer networks, the hardware to support these services grows in size and complexity. Data centers quickly fill with more and more servers as demand for services grow. This continual demand for more computing power results in more hardware. And as more and more hardware is added, management of the hardware, whether maintaining the networks, repairing damaged equipment, or other tasks, grows more and more complicated.

Blade servers offer an increasingly popular solution to the growing pains associated with other server systems. Blade servers are generally made up of thin blade modules (sometimes simply referred to as "blades") that fit within a blade enclosure designed to provide support, power, and cooling to the blade server system. The core concept behind a blade server system is to remove from individual blade modules components that are unnecessary for the function that the particular blade is to perform. For example, a particular blade designed for processing may have a number of processors and sufficient memory to support the processing operations, but have all hard drive components removed, basic IO devices supporting peripherals such as keyboards removed, and power supply components removed. In contrast, a storage blade may have minimal processing capability but a great deal of storage. Removing items unrelated to the task the particular blade is to perform saves space, power, reduces heat, and decreases the number of components which may fail.

FIG. 1 shows one example of the basic structure of a blade server system. FIG. 1 shows a chassis 110 with backplane 120, a passage 116, a tray 112, and dividers 114. The chassis 110, also referred to as the enclosure, may provide a variety of services for the blade server system. For example, the chassis 110 may provide power for the blade server system and its constituent components. The chassis 110 may also provide cooling. The chassis 110 will typically have a tray 112 which, together with the dividers 114, separates the chassis 110 into blade module sized compartments. The user then inserts the individual blade modules into the compartments to integrate them into the system.

One component of a blade server system is a backplane 120, also referred to as a midplane. The blade modules typically plug into the backplane 120 which allows them to network and also provides power. In many embodiments, the backplane 120 is a passive component of the system in order to minimize the risk of a backplane failure.

However, the traditional backplane 120 has a number of failings. First, given the connectivity that the backplane 120 may need to provide, the backplane 120 is often a circuit board with considerable thickness. This makes manufacturing the board much more expensive and technically difficult to ensure that only the proper connections are made. In addition, the backplane 120 is generally a "one size fits all" solution for the blade server system; that is, a backplane 120 may be sized for a 3U system, a 20U system, or some other dimension. However, once the capacity of the backplane 120 is reached, the user must make an expensive upgrade to a new backplane 120. In other words, the traditional backplane 120 is not scalable.

The backplane 120 is generally designed to include only passive components since, if the backplane 120 fails, the entire blade server system is offline. Keeping the backplane 120 passive greatly reduces the risk of failure. However, active components may be useful in a backplane 120. For example, in a large system, signal buffers may be useful to strengthen signals that are travelling a long distance through the backplane 120. In addition, active components can provide valuable functions such as translating from one protocol to another (such as 10 GB Ethernet to Fibre Channel). Traditional blade server systems require a user to either forgo the benefits of these active components or force the user to incorporate them elsewhere in the system, which uses more space and complicates management. The backplane 120 simply is not a flexible solution. The backplane 120, once created, exists as it was created. The functionality or connectivity of the backplane 120 cannot be adjusted or tailored to the changing needs of the user.

In addition, the backplane 120 is a physical barrier to air flow through the chassis 110. Controlling the temperature in dense blade server systems is a significant challenge. Proper cooling of blade server systems and data centers is a field of expertise in and of itself. The barrier posed by the backplane 120 presents an obstacle since air needs to be circulated through the blade modules attached to the backplane 120. In many embodiments, the chassis 110 will house high-powered fans behind the backplane 120 which blow air through the passage 116 and thus circulate the air through the system. In short, cooling devices need to work around the backplane 120 as they cannot go through it. Even where holes are punched through the backplane 120, airflow is still restricted.

SUMMARY OF THE INVENTION

From the foregoing discussion, it should be apparent that a need exists for an apparatus, and system, for a scalable, composite, reconfigurable backplane. Beneficially, such an apparatus, system, and method would be thinner than a traditional backplane, thus simplifying manufacture. In addition, the solution would be scalable such that the backplane can grow with the blade server system instead of being a component that the blade server system first grows into and then grows out of. The solution should also allow the integration of active components into the backplane without increasing the risk of a failure to the entire backplane system such that the entire backplane must be replaced. In addition, the backplane solution ideally does not restrict airflow through the system, thus allowing easier and more effective cooling.

The present invention has been developed in response to the present state of the art, and in particular, in response to the problems and needs in the art that have not yet been fully solved by currently available backplanes and blade server systems. Accordingly, the present invention has been developed to provide an apparatus, system, and method for a scalable, composite, reconfigurable backplane that overcome many or all of the above-discussed shortcomings in the art.

The apparatus, in one embodiment, is a scalable composite backplane with a first blade aggregation module and one or more transition cards. The first blade aggregation module communicatively connects one or more computing devices that are connected to the first blade aggregation module through the transition cards. One or more transition cards may include two or more connectors. The two or more connectors include a first card connector that connects to the first blade aggregation module, and additional card connectors that connect to one or more computing devices. In one embodiment, each transition card includes at least one communication connection between at least two of the connectors. The first blade aggregation module connects to the first card connector of one or more of the transition cards. The union of a first transition card, the first blade aggregation module, and a second transition card defines an airflow passage that permits substantially unobstructed airflow through a portion of the scalable composite backplane.

In one embodiment of the apparatus, a computing device may be one of a blade module, a unit aggregation module, a blade aggregation module, and one or more external computing devices. The one or more external computing devices may be computing devices connected to an additional card connector through a network connection.

In one embodiment, the blade aggregation module includes one or more switches and two or more switch connectors that connect with the first card connectors of the one or more transition cards. The two or more connectors may also provide a mechanical connection and an electrical connection providing power.

The apparatus, in one embodiment, includes a second blade aggregation module. In this embodiment, one of the one or more additional card connectors may communicatively connect to the second blade aggregation module. The union of the first transition card, the first blade aggregation module, the second transition card, and the second blade aggregation module may define the airflow passage through a portion of the scalable composite backplane. The first blade aggregation module connected with one or more transition cards may be considered a first unit, and the composite backplane may include one or more additional units. The unit may also include a second blade aggregation module. The one or more units can be communicatively connected through one or more unit aggregation modules, which also continue the airflow passage along a longitudinal axis of the airflow passage. In yet a further embodiment, the one or more unit aggregation modules may include external connectors communicatively connecting with one or more external computing devices.

In one embodiment the backplane includes a power distribution grid. In a further embodiment, the transition cards distribute power to one or more computing devices. The blade aggregation modules may distributes the power to the one or more transition cards. The apparatus may also include one or more baseboard management controllers (BMCs) that control power sequencing of the scalable, composite backplane. One or more blade modules may include one or more BMCs, and the blade modules are attached to the scalable, composite backplane. Each blade aggregation module further includes one or more BMCs. Additionally, each unit aggregation module may include one or more BMCs.

In an additional embodiment, the apparatus may include a BMC master that creates a power sequencing order. In one embodiment, the one or more BMCs on each blade module turn on power to the one or more computer components according to the power sequencing order provided by the BMC master. In yet a further embodiment, the apparatus includes a communications network and a management network, and the one or more BMCs have communications access over the communications network and the management network.

The transition cards may also include a signal conditioning module that provides signal regeneration, electrical-to-optical conversion, optical-to-electrical conversion, retiming, or signal restoration. Transition cards may include a signal bridge module that converts a signal from one communications protocol to a second communications protocol. In yet another embodiment, at least one transition card includes a switch.

Another embodiment of the scalable, modular backplane is also provided with a first blade aggregation module and a second aggregation module. The first blade aggregation module and the second blade aggregation module each may include one or more switches. The apparatus may also include two or more transition cards, wherein each transition card includes a top connector that communicatively connects to the first blade aggregation module and a bottom connector that communicatively connects to the second blade aggregation module. Each transition card may also include a front connector that communicatively connects to a blade module, and a back connector that communicatively connects to a unit aggregation module or a network. The first blade aggregation module may be connected to the top connector of the two or more transition cards, and the second blade aggregation module may be connected to the bottom connector of the two or more transition cards. The two or more transition cards communicatively connected to the first blade aggregation module and second blade aggregation module may be in parallel with the width of the first blade aggregation module and the second blade aggregation module.

In one embodiment, the apparatus may include one or more airflow passages allowing air flow through the scalable, modular backplane, wherein the airflow passages are the open areas between the first blade aggregation module joined to the two or more transition cards. The two or more transition cards may further be joined to the second blade aggregation module.

A system of the present invention is also presented. The system substantially includes the modules and embodiments described above with regard to the apparatus. In one embodiment, the system includes one or more blade modules, wherein each blade module includes an interior airflow channel along the length of the blade module. The system may also include a first blade aggregation module that communicatively connects one or more connected computing devices. The system may also include one or more transition cards, wherein each transition cards includes two or more connectors. The two or more connectors may include a first card connector that connects to the first blade aggregation module and one or more additional card connectors that connect to one or more computing devices. Each transition card may also include at least one communication connection between at least two of the connectors. The first blade aggregation module may be connected to the first card connector of a first transition card and the first card connector of a second transition card, wherein the union defines an airflow passage continuing the interior airflow channel of a first blade module. The airflow passage permits substantially unobstructed airflow through the interior airflow channel of the first blade module and through the scalable composite backplane.

In one embodiment, the system may include a chassis. The chassis may include one or more power connectors that connect with a power source and one or more power supplies generating one or more regulated direct current (DC) voltages. In further embodiments, the chassis may include one or more trays configured to support a row of blade modules and one or more blade aggregation module supports providing structural support for one or more blade aggregation modules.

In one embodiment, the system may include a second blade aggregation module, wherein one or more transition cards connect to the first blade aggregation module, the second blade aggregation module, and one or more blade modules. In another embodiment, a first set of transition cards connects to one or more unit aggregation modules and a second set of transition cards connects to one or more external computing devices. In a further embodiment, one or more additional blade aggregation modules, the one or more blade modules, the one or more unit aggregation modules, and the one or more transition cards are hot-pluggable.

A method of the present invention is also presented for implementing a scalable, modular backplane. The method in the disclosed embodiments substantially includes the steps necessary to carry out the functions presented above with respect to the operation of the described apparatus and system.

Reference throughout this specification to features, advantages, or similar language does not imply that all of the features and advantages that may be realized with the present invention should be or are in any single embodiment of the invention. Rather, language referring to the features and advantages is understood to mean that a specific feature, advantage, or characteristic described in connection with an embodiment is included in at least one embodiment of the present invention. Thus, discussion of the features and advantages, and similar language, throughout this specification may, but do not necessarily, refer to the same embodiment.

Furthermore, the described features, advantages, and characteristics of the invention may be combined in any suitable manner in one or more embodiments. One skilled in the relevant art will recognize that the invention may be practiced without one or more of the specific features or advantages of a particular embodiment. In other instances, additional features and advantages may be recognized in certain embodiments that may not be present in all embodiments of the invention.

These features and advantages of the present invention will become more fully apparent from the following description and appended claims, or may be learned by the practice of the invention as set forth hereinafter.

BRIEF DESCRIPTION OF THE DRAWINGS

In order that the advantages of the invention will be readily understood, a more particular description of the invention briefly described above will be rendered by reference to specific embodiments that are illustrated in the appended drawings. Understanding that these drawings depict only typical embodiments of the invention and are not therefore to be considered to be limiting of its scope, the invention will be described and explained with additional specificity and detail through the use of the accompanying drawings, in which.

DETAILED DESCRIPTION OF THE INVENTION

Many of the functional units described in this specification may themselves be, or comprise components that are a combination of hardware and software. For example, a particular item may be implemented as a hardware circuit comprising custom VLSI circuits or gate arrays, off-the-shelf semiconductors such as logic chips, transistors, or other discrete components. Such devices may also be implemented in programmable hardware devices such as field programmable gate arrays, programmable array logic, programmable logic devices or the like.

Reference throughout this specification to "one embodiment," "an embodiment," or similar language means that a particular feature, structure, or characteristic described in connection with the embodiment is included in at least one embodiment of the present invention. Thus, appearances of the phrases "in one embodiment," "in an embodiment," and similar language throughout this specification may, but do not necessarily, all refer to the same embodiment.

Furthermore, the described features, structures, or characteristics of the invention may be combined in any suitable manner in one or more embodiments. In the following description, numerous specific details are provided, such as examples of programming, software modules, user selections, network transactions, database queries, database structures, hardware modules, hardware circuits, hardware chips, etc., to provide a thorough understanding of embodiments of the invention. One skilled in the relevant art will recognize, however, that the invention may be practiced without one or more of the specific details, or with other methods, components, materials, and so forth. In other instances, well-known structures, materials, or operations are not shown or described in detail to avoid obscuring aspects of the invention.

Figure 1:
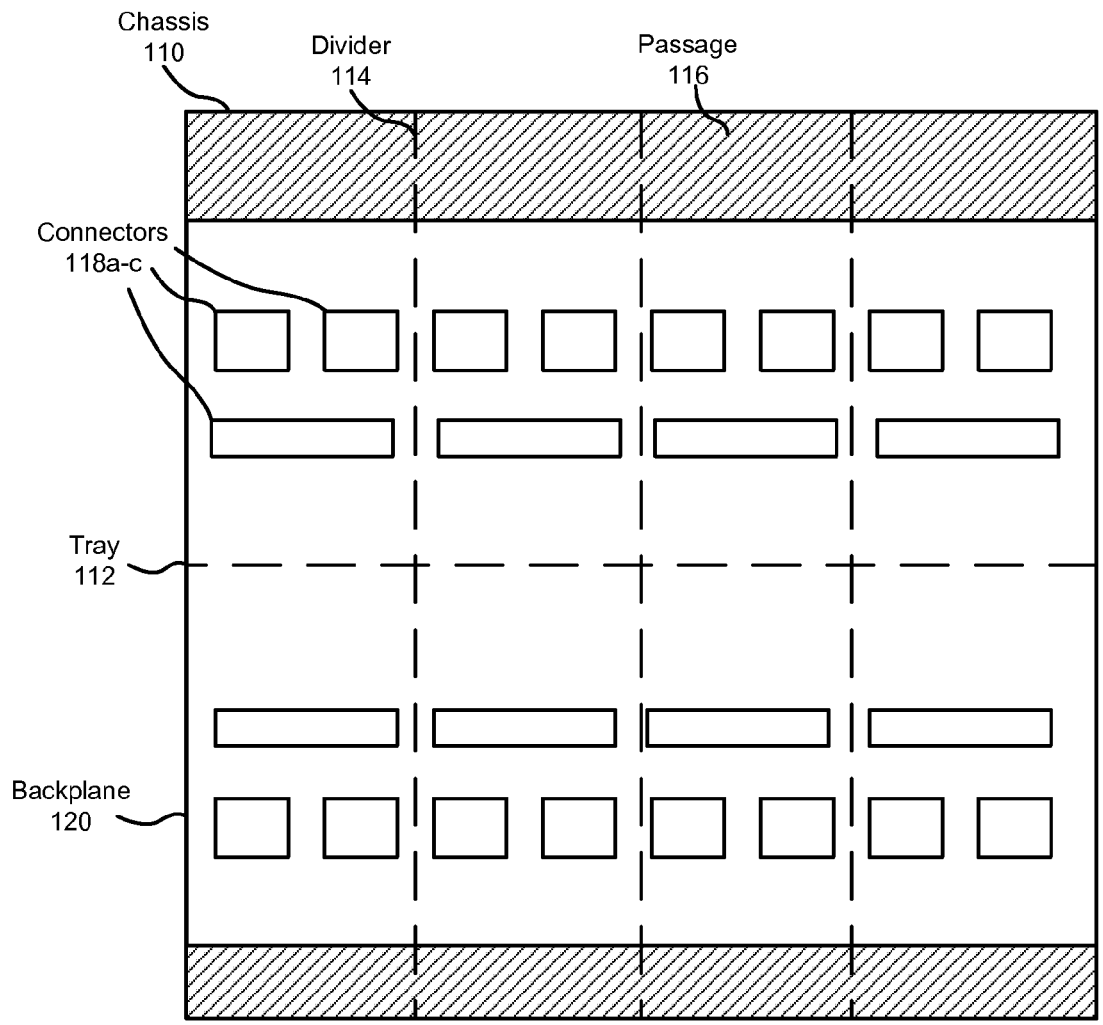
FIG. 1 is a schematic block diagram illustrating one embodiment of a prior art backplane.
Figure 2:
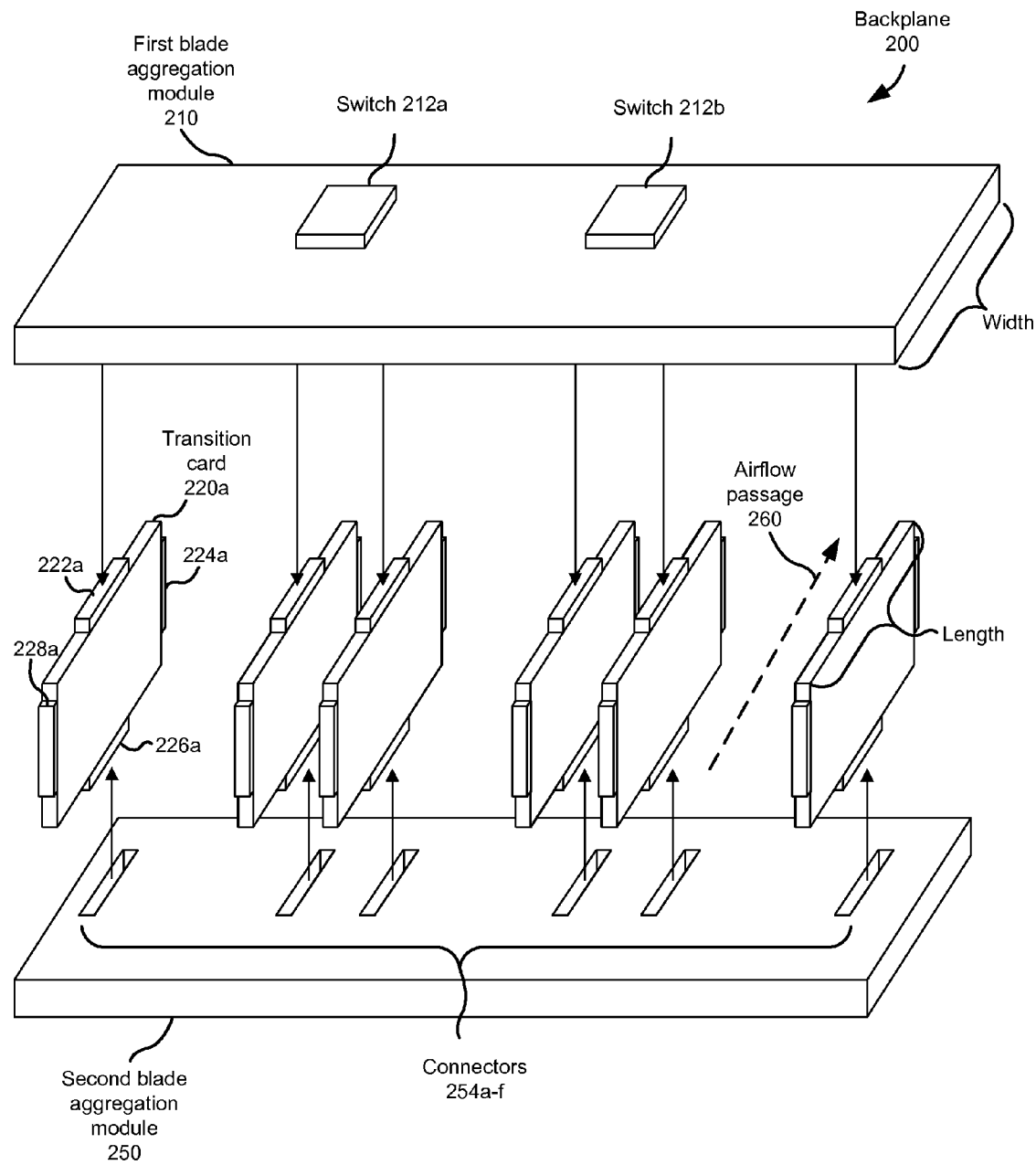
FIG. 2 is a schematic block diagram illustrating an exemplary connection of components of a backplane in accordance with the present invention.

FIG. 2 depicts a scalable, composite backplane 200 comprising a first blade aggregation module 210, transition cards 220a-f, and a second blade aggregation module 250. While FIG. 2 shows only six transition cards 220a-f, those of skill in the art will appreciate that the number of transition cards 220a-f and associated connectors 254a-f can vary. For example, in a typical embodiment, a unit of a blade server system may have eight blade modules with two connectors to the backplane 200. As such, the backplane 200 would have sixteen transition cards as opposed to the six transition cards 220a-f shown.

Figure 5:
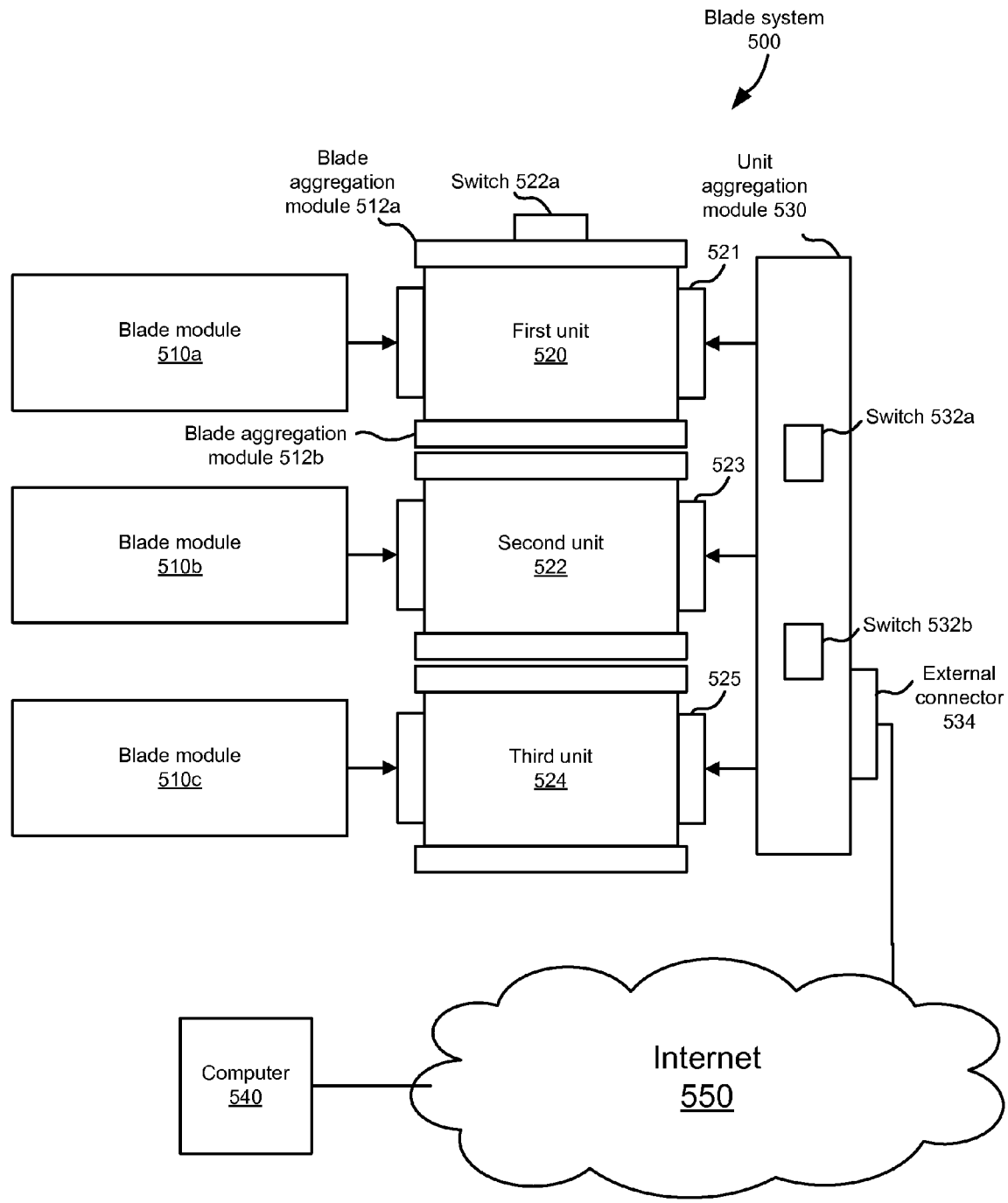
FIG. 5 is a schematic block diagram of one embodiment of a blade system in accordance with the present invention.

The backplane 200 provides connectivity between a variety of attached computing devices, as discussed in greater detail below. Computing devices include a wide variety of devices which communicate and receive data. For example, a blade aggregation module 210, blade module, unit aggregation module, or a transition card may be a computing device. Computing devices can also include devices such as switches, routers, bridges, load balancers, firewalls, gateways, domain servers, and others known to those of skill in the art. The backplane 200 provides a scalable, modular, composite backplane solution that can grow and adapt in accordance with the needs of the customer. In addition, as described below, in one embodiment the backplane 200, like the modular blades 510a-c of FIG. 5, is composed of identical modular parts making replacement, maintenance, and manufacture much simpler.

The backplane 200 includes a first blade aggregation module 210 and a second blade aggregation module 250. The blade aggregation modules 210 and 250 enable communications by communicatively connecting one or more connected computing devices. This connection may be provided through one or more of the transition cards 220a-f, as discussed in greater detail below. In one embodiment, the blade aggregation modules 210 and 250 provide this communications connection through one or more switches, such as the switches 212a-b shown on the first blade aggregation module 210. The switches 212a-b are generally computing devices that connect network segments. Various forms of switches are known to those in the art. For example, the switches 212a-b may be part of a router which incorporates one or more switches 212a-b. Those of skill in the art will appreciate, however, that the blade aggregation modules 210 and 250 may provide the necessary connectivity through means or devices other than switches.

The blade aggregation modules 210 and 250 further comprise connectors such as the connectors 254a-f shown in relation to the second blade aggregation module 250. Where the second blade aggregation module 250 includes switches, these connectors 254a-f may be classified as switch ports. The connectors 254a-f pair with the card connectors of the transition cards 220a-f. In the exemplary illustration of FIG. 2, the connectors 254a-f connect with the card connectors 226a-f. The connectors 254a-f provide the necessary communications connection with the switches 212a-b or other devices providing network connectivity on the first blade aggregation module 210. In addition, the connectors 254a-f receive a corresponding card connector, such as card connectors 226a-f, and make a mechanical connection that holds the transition cards 220a-f in a particular orientation. The connection may also be an electrical connection which can be used to provide power, as discussed in greater detail below.

In one embodiment, the first blade aggregation module 210 is identical to the second blade aggregation module 250. In such an embodiment, the blade aggregation modules 210 and 250 are reversible; that is, the first blade aggregation module 210, rotated into the illustrated orientation as that of the second blade aggregation module 250, is identical to and can take the place of the second blade aggregation module 250. The same manipulation may be performed on the second blade aggregation module 250 such that it functions as the top connection provided by the first blade aggregation module 210 in FIG. 2.

In addition, the blade aggregation modules 210 and 250 may be symmetrical and rotatable around the center. That is, if the first blade aggregation module 210 is rotated about its center such that the left side shown in FIG. 2 is on the right, the first blade aggregation module 210 still provides full and proper connectivity to attached computing devices. As such, the blade aggregation modules 210 and 250 are highly flexible, interchangeable pieces with multiple correct orientations. As a result, a vendor requires fewer distinct pieces to be manufactured, and in addition, maintenance is simplified for a user since the blade aggregation modules 210 and 250 have multiple correction orientations.

The second blade aggregation module 250 may be used to provide redundancy and increased bandwidth to the blade server system. In one embodiment, the second blade aggregation module 250 makes communications connections with computing devices by way of the transition cards 220a-f that are identical to those made by the first blade aggregation module 210. This duplication of communications connections provides redundancy in the backplane 200 in case of a failure in the first blade aggregation module 210. In addition, the second blade aggregation module 250 may make available increased bandwidth by supplying more communications pathways for the backplane 200 and thus the blade server system as a whole.

The second blade aggregation module 250 may not, however, be identical to the first blade aggregation module 210. In one embodiment, the second blade aggregation module 250 is simply a placebo aggregation module which provides no connectivity. Such an embodiment may simply be used to provide mechanical connectivity, power, structure, and stability where only one blade aggregation module (such as the first blade aggregation module 210) is used. A placebo may be a simple plastic form provided at little or no cost. This possibility reduces the expense to a potential customer who does not need the additional connectivity provided by the second blade aggregation module 250. However, if at a future time the customer's demands increase, the backplane 200 can be reconfigured by inserting a second blade aggregation module 250 in place of the placebo aggregation module.

FIG. 2 also illustrates transition cards 220a-f. Only transition card 220a, and its associated connectors, is labeled in FIG. 2 in order to make the Figure more easily understood; however, those of skill in the art will appreciate that the naming convention in relation to transition card 220a applies equally to the other transition cards 220b-f. The transition cards 220a-f serve as mechanical supports and connectors of the first blade aggregation module 210 and the second blade aggregation module 250. The transition cards 220a-f also provide communications connectivity between connected computing devices. The transition cards 220a-f may connect to the blade modules and provide a communications connection between the blade modules and the first blade aggregation module 210 and the second blade aggregation module 250. The connections made by the transition cards 220a-f are explained in greater detail below and in connection with later figures. The transition cards 220a-f may also serve as a power distribution channel, providing necessary voltages to the attached computing devices.

As shown, each transition card 220a-f includes four connectors 222a-f, 224a-f, 226a-f, and 228a-f. The number of connectors, however, is not limited to four. Nor does each transition card 220a-f need to have identical connector configurations. For example, transition card 220d may, in one embodiment, have only a front connector 226a and a top connector 222a. Again, the transition cards 220a-f are scalable and highly configurable such that a customer has a variety of options in setting up a backplane 200 and associated blade server system.

Each transition card 220a-f includes a first card connector 222a-f that connects to the first blade aggregation module 210 by way of connectors similar to the connectors 254a-f shown on second blade aggregation module 250. The first card connector 222a establishes a communications connection with the first blade aggregation module 210, and may further provide a mechanical connection as well as an electrical connection. While the depicted connectors 222a-f are edge connectors, a variety of connector types are available and may be used equally well. For example, in an alternative embodiment, the transition cards 220a-f pass through the first blade aggregation module 210 rather than connect to the bottom of the first blade aggregation module 210. Such an embodiment could make use of a through-board connector.

Figure 3:
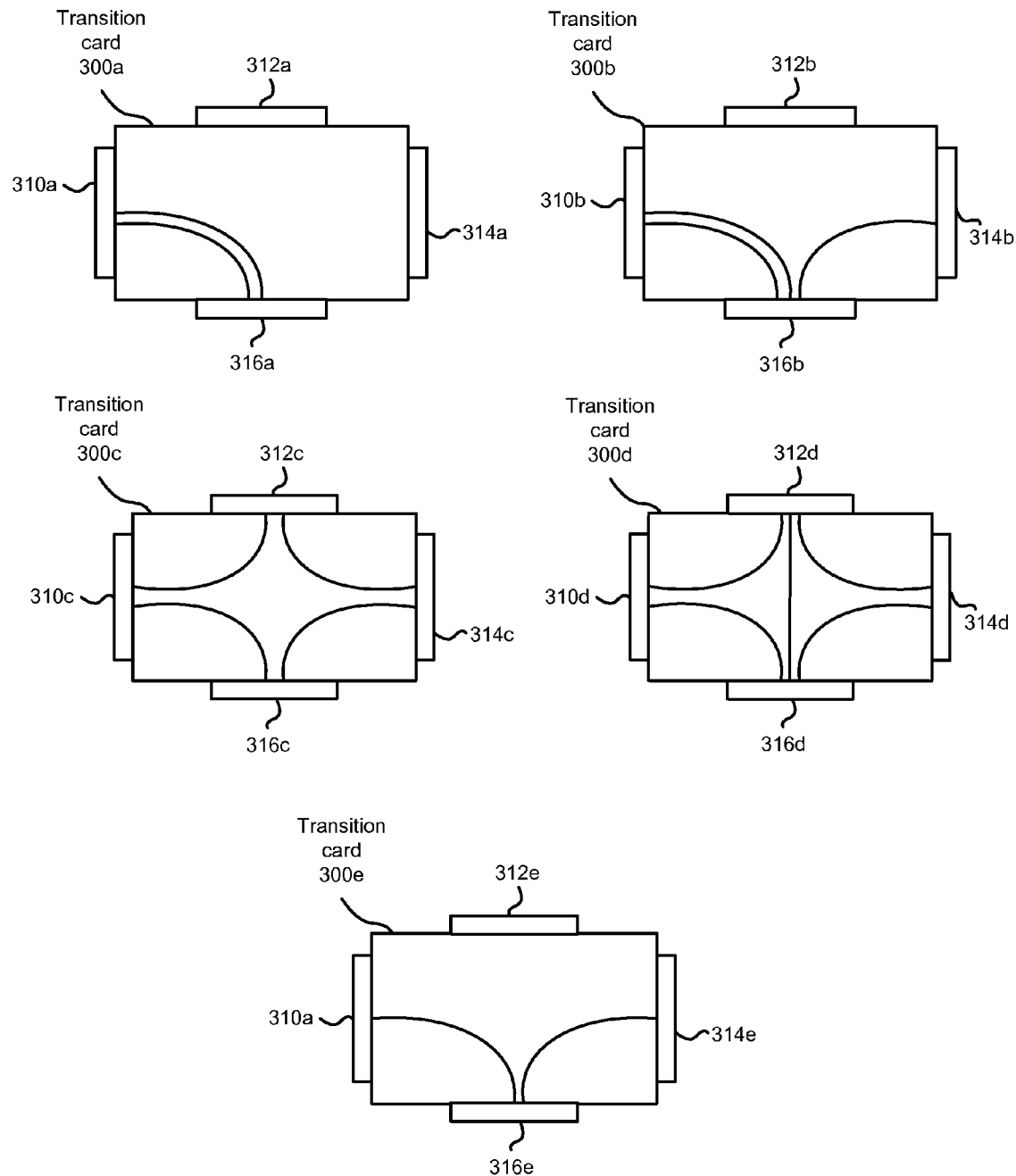
FIG. 3 is a schematic block diagram illustrating various configurations for transition cards in accordance with the present invention.

The transition cards 220a-f also include one or more additional card connectors such as connectors 224a-f, 228a-f, and 226a-f. The additional card connectors connect to one or more computing devices and establish communications connectivity with them. A computing device may be a blade module, a unit aggregation module, or an external computing device connected to the transition card 220a-f of the backplane 200 over a network. The transition cards 220a-f establish at least one communications connection between at least two of the connectors. However, a wide variety of communications connections can be made, as shown in FIG. 3. Examples of external connector for cabling externally are shown below.

The first blade aggregation module 210 connects to the first card connectors 222a-f of the transition cards 220a-f. In one embodiment, the transition cards 220a-f are connected to the first blade aggregation module 210 such that the transition cards 220a-f are parallel with the width of the first blade aggregation module 210. When the first blade aggregation module 210 is connected to the transition cards 220a-f, by pushing it in the direction of the arrows until the connection is made, a space is left running along the length of the transition cards 220a-f. Thus, the union of a two transition cards and the first blade aggregation module 210 defines an airflow passage 260 which permits substantially unobstructed airflow through a portion of the backplane 200. While the transition cards 220a-f themselves may present some obstruction to the airflow, air can be circulated into and out of the blade modules through the airflow passage 260 with little interference. Nor does the addition of the second blade aggregation module 250 to the backplane 200, by moving it in the direction of the associated arrows until it connects with the transition cards 220a-f, obstruct the airflow passage 260.

The union of the first blade aggregation module 210 and transition cards 220a-f provides interconnectivity between computing devices which are in turn connected to the transition cards 220a-f. In certain embodiments, the first blade aggregation module 210 may be configured to connect to other computing devices. These additional connections may be made, for example, out the back, of the first blade aggregation module 210. The connection of the first blade aggregation module 210 and one or more transition cards 220a-f constitutes a first unit. As described, a second blade aggregation module 250 may be added to the unit to provide redundancy and additional bandwidth. In one embodiment, a unit may be a row of a backplane 200 which receives one or more blade modules.

FIG. 3 shows five exemplary embodiments of transition cards 300a-e. As discussed above, transition cards 300a-e need not be identical, as shown in FIG. 3. Transition card 300a, for example, provides 2 communications connections between a computing device at the connector 310a and a computing device at the connector 316a. For example, a blade module may be attached at connector 310a and a blade aggregation module may be attached at connector 316a. In the particular embodiment, the transition card 300a provides additional bandwidth through the double connection. The connectors 312a and 314a may not need to be present in transition card 300a. However, the connectors 312a and 314a may still provide mechanical support to the backplane and may also still provide power distribution through one or more power distribution connections (not shown).

Transition card 300b provides the same connectivity options as transition card 300a, with the addition of a communications connection between the 316b connector and the 314b connector. In one embodiment, the transition cards 300a-e have multiple possible orientations. For example, the transition card 300b as shown provides double connectivity from the front (connector 310b) to the bottom (connector 316b), and single connectivity out the back (connector 314b). The transition card 300b may, however, be rotated clockwise 180 degrees to provide single connectivity between the front (connector 314b) and the top (connector 316b), while providing double connectivity from the top (connector 316b) to the back (connector 310b). As such, a single transition card 300a-e may offer various connection options simply by changing its orientation.

Transition card 300c provides connectivity paths from the front (connector 310c) to both the top (connector 312c) and the bottom (connector 316c). Those of skill in the art will appreciate that such a configuration may enable communications between every computing device connected to a connector of the transition card 300c. The communications connection may not, however, be a direct path. For example, for a computing device attached to connector 310c to communicate with a computing device attached to connector 314c, a computing device (such as a blade aggregation module) attached to one of connector 312c and connector 316c must enable the communication. Those of skill in the art will further appreciate that, in the case where one blade aggregation module is attached to the connector 312c and another is attached to connector 316c, the blade aggregation modules provide redundant connections and additional bandwidth into and out of connectors 310c and 314c.

Transition card 300d further incorporates a cross-connect connection directly connecting a computing device attached to connector 312d with a computing device attached to connector 316d. In one embodiment, the cross-connect facilities direct communications between a first blade aggregation module attached to the connector 312d and a second blade aggregation module attached to the connector 316d.

Figure 4:
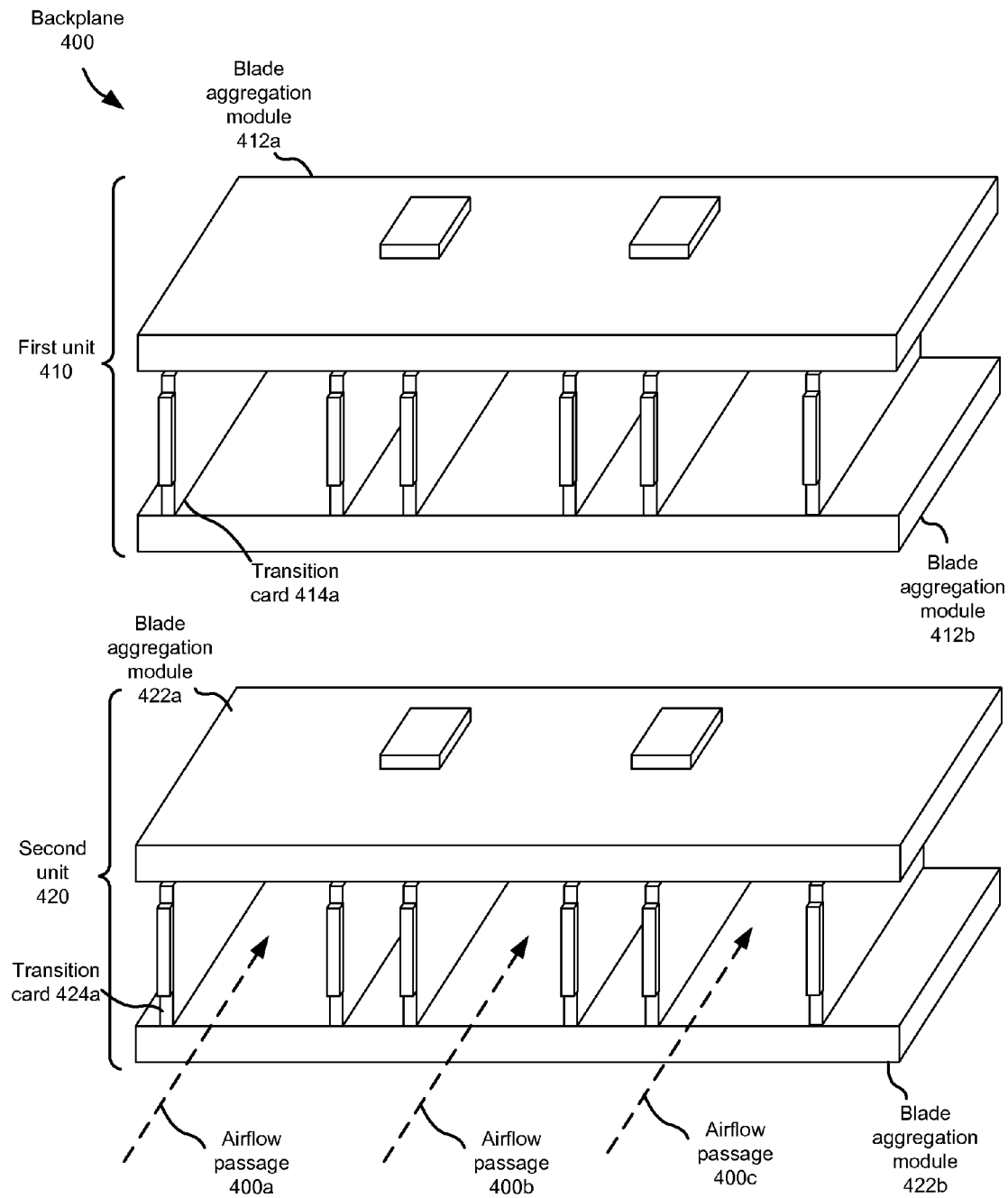
FIG. 4 is a schematic diagram of two units of a backplane in accordance with the present invention.

FIG. 4 is an illustrative representation of a backplane 400 comprising a first unit 410 and a second unit 420. As discussed above, in one embodiment, a first unit 410 comprises a single blade aggregation module 412a communicatively connected to one or more transition cards 414a-f. In the depicted embodiment, the first unit 410 further comprises a blade aggregation module 412b connected to the transition cards 414a-f. One or more blade modules may then be connected to the transition cards 414a-f. In one embodiment, each blade module connects to two transition cards 414a-f. For example, a blade module may attach to the transition cards 414a and 414b, while a second blade module attaches to transition cards 414c and 414d, and so on until all transition cards 414a-f are occupied. In such an arrangement, the blade modules are networked through the transition cards 414a-f and the blade aggregation modules 412a and 412b. Thus, each blade module can communicate data with every other blade module connected to the first unit 410. In the depicted embodiment, additional connectivity may be provided through the back of the first unit 410. Additional connections through the back are discussed in greater detail below.

A second unit 420 in FIG. 4 is configured similarly to the first unit 410. In connection with the second unit 420, however, airflow passages 400a-c are shown. In one embodiment, the blade modules include fans that circulate air through the blade modules. The airflow passages 400a-c provide a channel through which fresh air may be drawn into the blade module, and through which heated air may be removed. Those of skill in the art will also appreciate that air may additionally circulate through the unlabeled passages of second unit 420.

FIG. 5 illustrates one embodiment of a blade system 500 from a side perspective. FIG. 5 illustrates a first unit 520, a second unit 522, and a third unit 524, as discussed above in connection with FIG. 4. FIG. 5 illustrates blade modules 510a-c being connected to the connectors of the first unit 520, second unit 522, and third unit 524. Those of skill in the art will appreciate that, in light of the discussion in FIG. 4, the first unit 520 may extend into the page, and that additional blade modules may connect into the illustrated units. For example, each unit may have four blade modules connected to it.

As discussed in FIG. 4, the first unit 520, second unit 522, and third unit 524 each provide connectivity among the various blade modules connected to the particular unit. FIG. 5 explicitly points out blade aggregation modules 512a-b as part of the first unit 520, and also shows a switch 522a as part of the blade aggregation module 512a. Those of skill in the art will appreciate that comparable configurations are implicitly include in the second unit 522 and the third unit 524.

Connectivity, however, is also required between the first unit 520, the second unit 522, and the third unit 524. Thus, the blade system 500 may also include a unit aggregation module 530 which communicatively connects the first unit 520, the second unit 522, and the third unit 524. In one embodiment, the unit aggregation module 530 connects such that the airflow passage continues unobstructed through the backplane.

In one embodiment, the unit aggregation module 530 connects to a connectors 521, 523, and 525 of the illustrated transition cards. As shown in FIG. 5, a blade module 510a-c may connect to the front of the transition card, while the unit aggregation module 530 connects to the back. The unit aggregation module 530 may comprise one or more switches 532a-b facilitating communications between one or more computing devices attached to the unit aggregation module 530. As discussed above in connection with the blade aggregation module, the unit aggregation module 530 is not limited to an implementation with a switch.

The unit aggregation module 530 may also include one or more external connectors for communicating with external computing devices. For example, the unit aggregation module 530 may have an external connector 534 which connects it to the internet 550. The external connector 534 and the connection protocol may be of a variety of types, such as 10 GB Ethernet, Fibre channel over a copper or optical connection, Infiniband, synchronous optical networking (SONET), PCI express, PCI express AS, or others known to those of skill in the art. The blade system 500 may communicate information to and from an external computing device, such as the computer 540, over this external connection. External connections are not limited to placement on one or more unit aggregation modules 530.

Those of skill in the art will appreciate that an external computing device any be a variety of different computing devices connected over a variety of different external connections. External connections are connections made to devices outside the blade system 500. The external connection, for example, may be to a WAN or a LAN. Similarly, an external computing device may be storage devices comprising part of a SAN, or distributed computers in a business's network. In short, computing devices may be any device which sends and receives data over a network.

Figure 6:
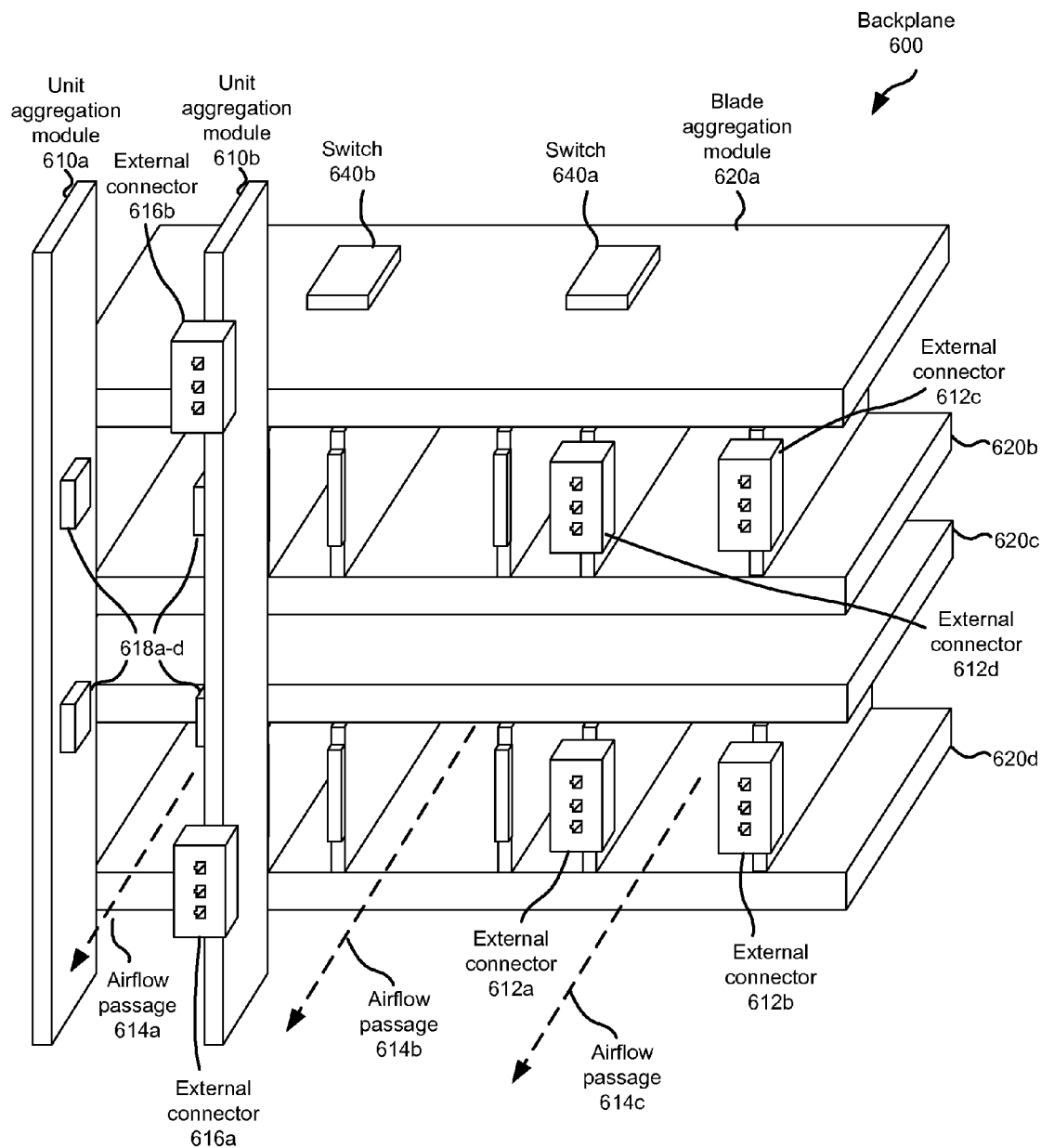
FIG. 6 is an exemplary illustration of a backplane in accordance with the present invention.

FIG. 6 is an illustration of the connectivity options from the back of a backplane 600. As discussed above, given the modular, reversible nature of the backplane 600, either side may be treated as the "front" or the "back". While connectivity may change, dependent upon the transition cards used, the backplane 600 provides the same core functionality in either direction. As such, one or more blade modules could be added to the back of the backplane 600 in addition to those blade modules connected to the front to create an even higher density blade server system.

FIG. 6 illustrates the addition of two unit aggregation modules 610a-b to the backplane 600. As discussed above, the unit aggregation modules 610a-b contain switches 618a-d. In this particular embodiment, transition cards connecting to the unit aggregation modules 610a-b establish a communications connection between the unit aggregation modules 610a-b and the blade aggregation modules 620a-d. The blade aggregation modules 620a-d similarly include switches such as switches 640a-b shown on blade aggregation module 620a. Since the devices attached to the backplane 600 (such as the modular blades) communicate with the blade aggregation modules 620a-d associated with the particular unit to which they are attached, the addition of the unit aggregation modules 610a-b which enable communications between units presents a backplane 600 where each connected computing device may communicate with every other connected computing device.

For example, the backplane 600 of a 20U blade server system may contain eight units. In a typical embodiment, a unit is a horizontal grouping such as a row. Connectivity across the row is provided by the blade aggregation modules 620a-d. The unit aggregation modules 610a-b communicatively connect the units in order to permit vertical communications between blade modules connected to different sets.

The unit aggregation modules 610a-b, like the blade aggregation modules 620a-d, enable communications to and from the computing devices attached to the transition cards. The unit aggregation modules 610a-b may also be identical and reversible, such that a particular unit aggregation module 610a has multiple correct orientations which establish a connection.

As with the blade aggregation modules 620a-d, the number of unit aggregation modules 610a-b in the blade server system 800 may vary. For example, a single unit aggregation module 610a is sufficient to enable communication between every blade module and every network-attached device, but may not have sufficient bandwidth for the ideal performance. In addition, the use of a single unit aggregation module 610a, while fully functional, may introduce longer latency periods between devices connected through a long path. Using multiple unit aggregation modules 610a-b provides more bandwidth, redundancy in case of failure, and may also shorten latency times in the blade server system incorporating the backplane 600.

Also shown in FIG. 6 are external connectors 612a-d. The external connectors 612a-d are configured to communicatively connect with one or more computing devices over an external network, as discussed above. As discussed above, the external connectors 612a-d may be configured for a variety of network communications connection types and protocols known to those of skill in the art. The external connectors 612a-d and the connection protocol may be of a variety of types, such as 10 GB Ethernet, Fibre channel over a copper or optical connection, Infiniband, synchronous optical networking (SONET), PCI express, PCI express AS, or others known to those of skill in the art. External computing devices, such as storage devices, client computers, and others can be connected through the external connectors 612a-d.

FIG. 6 also illustrates external connectors 616a-b incorporated into the unit aggregation module 610b. A variable number of external connectors 616a-b may be attached to the unit aggregation modules 610a-b in order to provide additional external connectivity options in the backplane 600.

Also evident in FIG. 6 is the maintenance of the airflow passages 614a-c, as discussed in FIG. 4, even after the addition of one or more unit aggregation modules 610a-b and one or more external connections through external connectors 612a-d. The addition of more elements to the backplane 600 does not obstruct airflow through the system.

Based on the needs for the particular blade server system, a customer may choose to add additional unit aggregation modules 610a-b, external connectors 612a-d and external connectors 616a-b, and blade aggregation modules 620a-d. As the backplane 600 is filled with devices, the customer may expand the size of the backplane 600 to create more available space. For example, a customer may add additional units (such as the first unit 520) to accommodate more blade modules, which additional units may in turn be incorporated into the backplane 600 with one or more unit aggregation modules 610a-b.

As a result, using four core connector pieces, (carrier cards, transition cards, blade aggregation modules, and unit aggregation modules), an immensely scalable and adaptable blade server system can be constructed. This approach inherently offers tremendous flexibility and provides a customer a product with a longer, more versatile lifecycle. In addition, maintenance and manufacture are considerably simplified for the manufacturer.

Those of skill in the art will appreciate that, given the flexibility of the configurations available for the backplane 600, additional uses may prove valuable. For example, rather than attach blade modules to the backplane 600, a customer may provide external connectors 612a-d on both the front and the back of the backplane 600. In such an embodiment, the backplane 600 is an extremely dense switch, capable of offering over three tiers of switching within a single enclosure. In the case of a modular blade, such as that described in the application filed by David Flynn et al. entitled "Apparatus, System, and Method for a Modular Blade", having U.S. application Ser. No. 11/952,119, the modular blade may be configured to act as a switch which makes external connections through its front and connects to the backplane 600 through its back. As a result, a four-plus tier switch can be created in an extremely dense package. Dense switches such as the one described may prove valuable in a number of fields, such as telecommunications.

Figure 7:
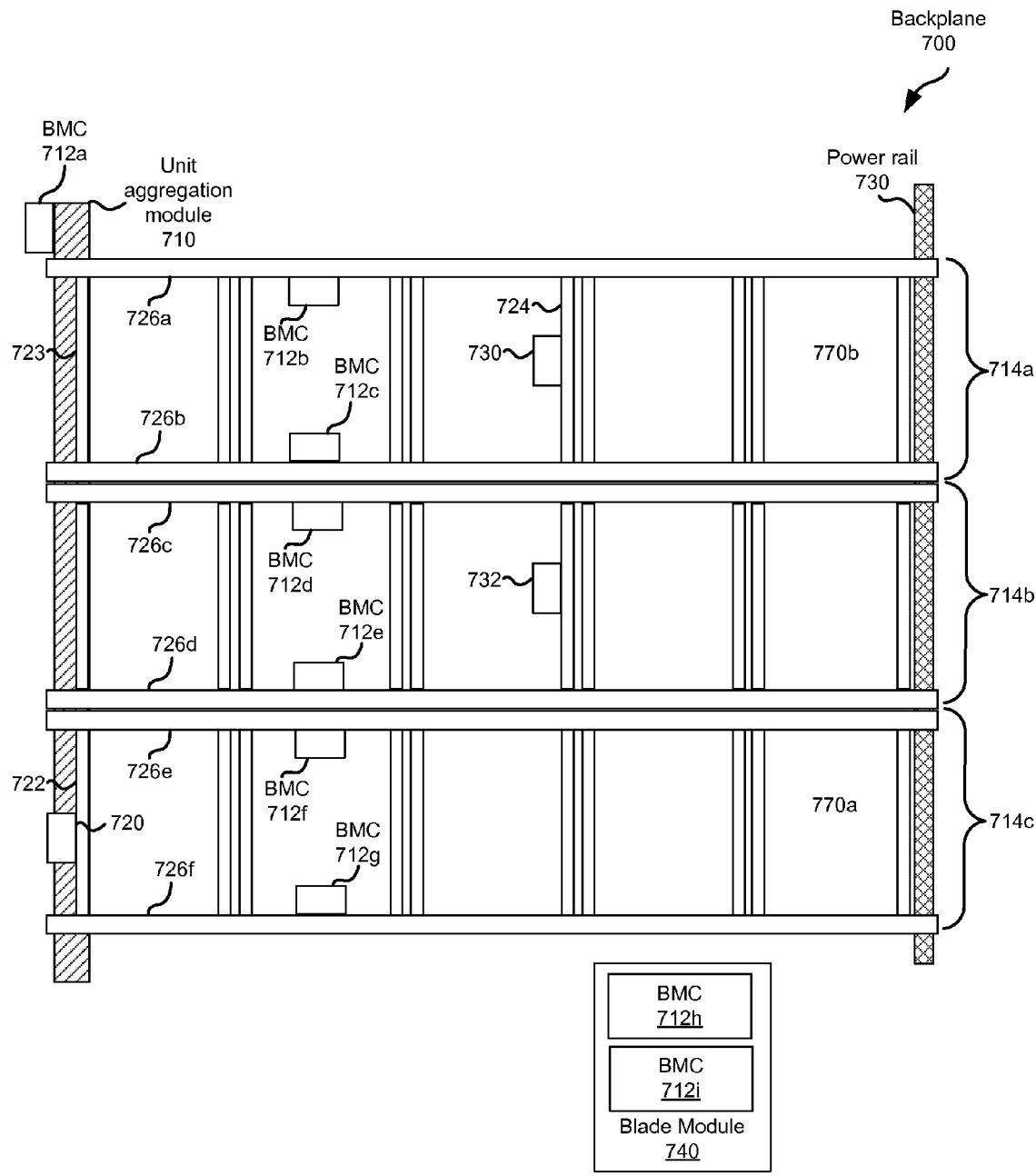
FIG. 7 is a second exemplary illustration of a backplane in accordance with the present invention.

FIG. 7 illustrates an additional embodiment of a backplane 700. The backplane 700 comprises three units 714a-c, with corresponding transition cards and blade aggregation modules, and a unit aggregation module 710. In the depicted embodiment, the unit aggregation module 710 connects into the backs of the transition cards in the column including transition cards 723 and 722.

FIG. 7 also includes a blade module 740 including baseboard management controllers (BMC) 712h-i. The blade module 740 may include one or more BMC 712h-i; for example, the blade module 740 may be a modular blade, as mentioned above. In one such an embodiment, the blade module 740 includes two transition cards which house the BMC 712h-i. The blade module 740, as shown in FIG. 7, is not connected to the backplane 700 and is illustrated to emphasize the possibility of one or more BMC 712h-i located on a blade module 740.

The blade module 740 may also include an interior airflow channel which runs along the length of the blade module 740 such that air may be circulated through the airflow channel in order to cool the various components of the blade module 740. The blade module 740 is connected to the backplane 700 such that its interior airflow channel aligns with the airflow passage of the backplane 700 described above. As such, the airflow passage effectively continues the interior airflow channel through the backplane 700.

Also shown in FIG. 7 is a power rail 730. The power rail 730 may be part of a power distribution grid which provides one or more voltages for the computing devices of the blade server system, such as the blade module 740, the blade aggregation modules, and the unit aggregation modules. In certain embodiments discussed below, one or more transition cards may also comprise an active computing device and as such may require power from the power distribution grid. The power rail 730 may also be considered part of a chassis which houses the backplane 700. In one embodiment, the power supplied along the power rail 730 is the output of one or more power supplies in the chassis.

The power distribution grid may distribute one or more common voltage values such as 48V, 12V, 5V, or 3.3V. The power distribution grid may also distribute a single voltage, such as 48V DC, and allow one or more of the computing devices of the backplane 700 to step down or step up the single voltage to one or more appropriate values. Those of skill in the art will recognize that multiple configurations and physical layouts are possible for a power distribution grid; in certain embodiments, the power distribution grid may simply comprise two power rails as part of the chassis offering, for example, power and ground.

In one embodiment, the blade aggregation modules 726a-f take one or more voltages off of the power rail 730 and feed the power to other components in the backplane 700. The blade aggregation modules 726a-f may include circuitry which steps the voltage up or down, and may provide a variety of different voltages to various computing devices in the backplane 700 or connected to it. The blade aggregation modules 726a-f may distribute power to one or more of these computing devices through the transition cards.

The transition cards, in turn, may distribute power to the unit aggregation module 710. The transition cards may also distribute power to the attached blade modules 740. As a result, power supplies can be concentrated on the chassis and don't impose additional heat and space costs on the individual blade modules 740. In such an embodiment, the transition cards will also include one or more electrical connections which provide the necessary channel for transferring power to the devices attached to the transition cards.

Those of skill in the art will appreciate that in a large blade server system made up of many computing devices and with many blade modules 740 attached, the power required by the blade server system is appreciable. A fully loaded 20U blade server system, for example, may require a three-phase power source. In large blade server systems, power cannot be provided to all of the computing devices in the system simultaneously. Blade server systems generally go through a power sequencing procedure in which various computing devices are powered on in a particular order in order to ensure that only a management amount of current is being drawn through the blade server system at a given time.

In one embodiment, the backplane 700 includes baseboard management controllers (BMCs) 712a-g which provide a management service for the backplane 700. The various blade modules 740 may also include BMCs such as the BMC 712i. The backplane 700 may also include two or more independent networks. For example, a communications network that provides the general communications paths for the connected computing devices such as the blade module 740 and external computer devices, and a management network for use by the BMCs 712*a-i* and management tools, exclusively. In one embodiment, the BMCs 712*a-i* can communicate with computer devices making up the backplane 700 and attached to the backplane 700 using either the communications network or the management network, or both.

The BMCs 712*a-i* can collectively control the power sequencing of the backplane 700 and the attached computing devices. In one embodiment, as shown in FIG. 7, each blade aggregation module 726*a-f* and each unit aggregation module 710 includes at least one BMC. One BMC 712*a-g* may be designated the BMC master. The BMC master generates or stores a power sequencing order and provide instructions to the other BMCs 712*a-i* as to the order in which to power the computing devices on. The BMC 712*g* on the first blade aggregation module 726*f* may, for example, be designated the BMC master.

The BMC master 712*g* may direct that the unit aggregation modules 710 be turned on first. As such, the BMC 712*a* on the unit aggregation module 710 to power on the unit aggregation module 710. The BMC master 712*g* may then direct that the BMCs 712*b-e* turn on the blade aggregation modules 726*a-f*. A particular sequence, such as left to right, or top to bottom, may be imposed on the relevant modules to prevent too many computing devices demanding too much power at the same time. With the various backplane 700 components turned on, the BMCs 712*b-g*, in accordance with a power sequence given by the master BMC 712*g*, may then turn on the individual blade modules 740 by instructing an associated BMC 712*h* or 712*i* to power on.

Those of skill in the art will appreciate that the above is simply one example of a possible power sequence, and that the present invention is not limited to any particular sequencing order. The power sequencing order, steps, and configuration may all vary based on the size of the system, the nature of the power source, along with other relevant factors.

One or more of the transition cards of the backplane 700 may also include active components as opposed to simply providing passive connectivity. For example, the transition card 722 may include a signal conditioning module 720. The active signal conditioning module 720 may perform one or more of a variety of functions, based on the needs of the blade server system. In one embodiment, the active signal conditioning module 720 provides signal regeneration, retiming, signal restoration, electrical to optical conversion, and optical to electrical conversion. The active signal conditioning module 720 may also be a signal buffer. The signal conditioning module 720 may also be a passive. Those of skill in the art will appreciate that signal regeneration may entail active signal processing that restores a signal such that it conforms with its original characteristics.

The signal conditioning module 720 may be useful, for example, in a blade server systems with path lengths of a significant distance. In the backplane 700, for example, signal regeneration may be needed if the blade module 740, connected into space 770*a*, sends a signal through the transition card and into the blade aggregation module 726*e*. The transition card, in this instance, may provide some signal regeneration. Or, a switch chip on blade aggregation module 726*f* may communicate data with a switch chip on the unit aggregation module 710 through a transition card containing a signal conditioner. By incorporating active signal conditioning modules such as the active signal conditioning module 720 at strategic locations in the backplane 700, the communications signal may be strengthened or corrected in order to ensure a higher degree of reliability in the communications process.

The transition cards may additionally include other active components such as a signal bridge module 730. The signal bridge module 730 may be used to convert a signal from communications protocol to a second communications protocol. The signal bridge module 730 may, for example, be used to connect the blade server system using one communications protocol to devices on a separate network communicating by another protocol. One or more transition cards may additionally include a switch 732 to facilitate network communications.

Thus, the backplane 700 has the advantages of incorporating active components into the backplane 700 without the substantial risk imposed by a traditional backplane. In a traditional backplane, if an active component in the backplane fails, the entire backplane must be replaced. In contrast, if an active component of the modular, composite, and scalable backplane 700 fails, the user can simply remove the faulty component (whether a transition card, blade aggregation module, or unit aggregation module), replace it with another, and continue to use the system. Ideally, the transition cards, blade aggregation modules, unit aggregation modules, and associated blade modules 740 are all hot-pluggable. As a result, the backplane 700 and the associated blade server system do not need to be powered off before the newly added components can being to function as part of the system.

Figure 8:
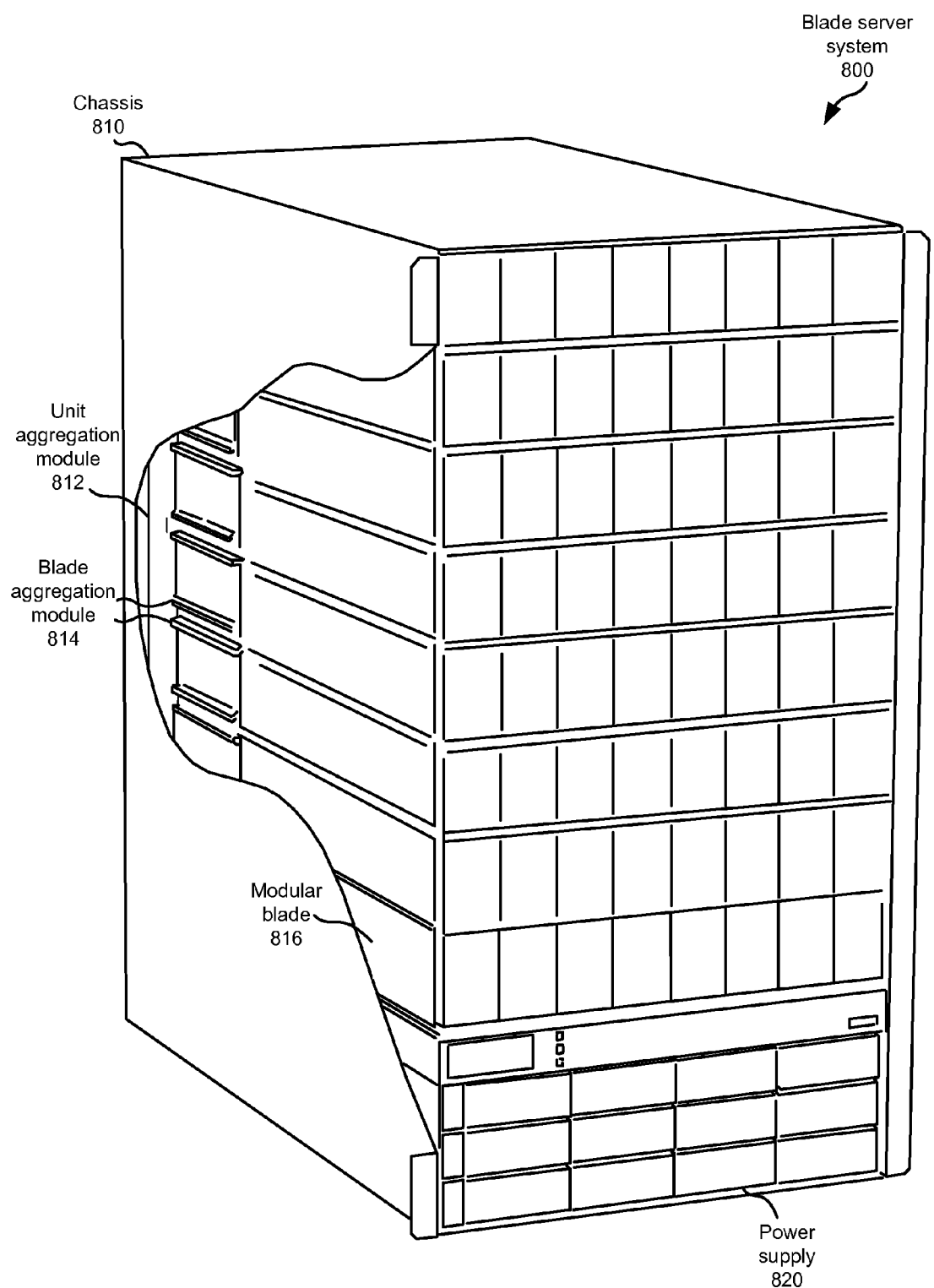
FIG. 8 is an illustration of a chassis and associated blade server system in accordance with the present invention.

FIG. 8 is an illustration of a blade server system 800. The depicted blade server system 800 is a 20U unit with sixty-four modular blades 816. All the modular blades 816 are communicatively connected via the blade aggregation modules 814, two of which are pointed out with particularity in FIG. 8. The blade server system 800 also comprises eight bladed units communicatively connected by one or more unit aggregation modules 812.

Also illustrated is a chassis 810. The chassis 810 provides support for the blade server system 800 and includes one or more power connectors that connect to a power source. The chassis 810 may connect to a single wall outlet, a three-phase power outlet, or other power connection known to those in the art. In addition, the chassis 810 includes one or more power supplies such as power supply 820. FIG. 8 illustrates twelve power supplies 820 for the blade server system 800. The power supplies 820 may include one or more redundant power supplies which simply acts as a backup in case of a failure in one of the other power supplies 820. The power supplies 820 may generate one or more regulated DC voltages, as is known to those in the art.

The chassis 810 also provides one or more trays that support a row of blade modules. In the depicted embodiment, one row of the blade server system 800 is a bladed unit. The trays may be keyed to fit in a particular manner with the modular blades 816 to ensure that a proper connection is made. The chassis 810 may also provide a number of supports for the blade aggregation modules 814. These supports may provide structural support and stability for the blade aggregation modules 814 and ensure that they do not slip out of position or shift.

In accordance with the present invention, a variety of different communications configurations may be implemented within a blade server system 800. Various topologies have different benefits and can be tailored to serve a variety of purposes.

Figure 9:
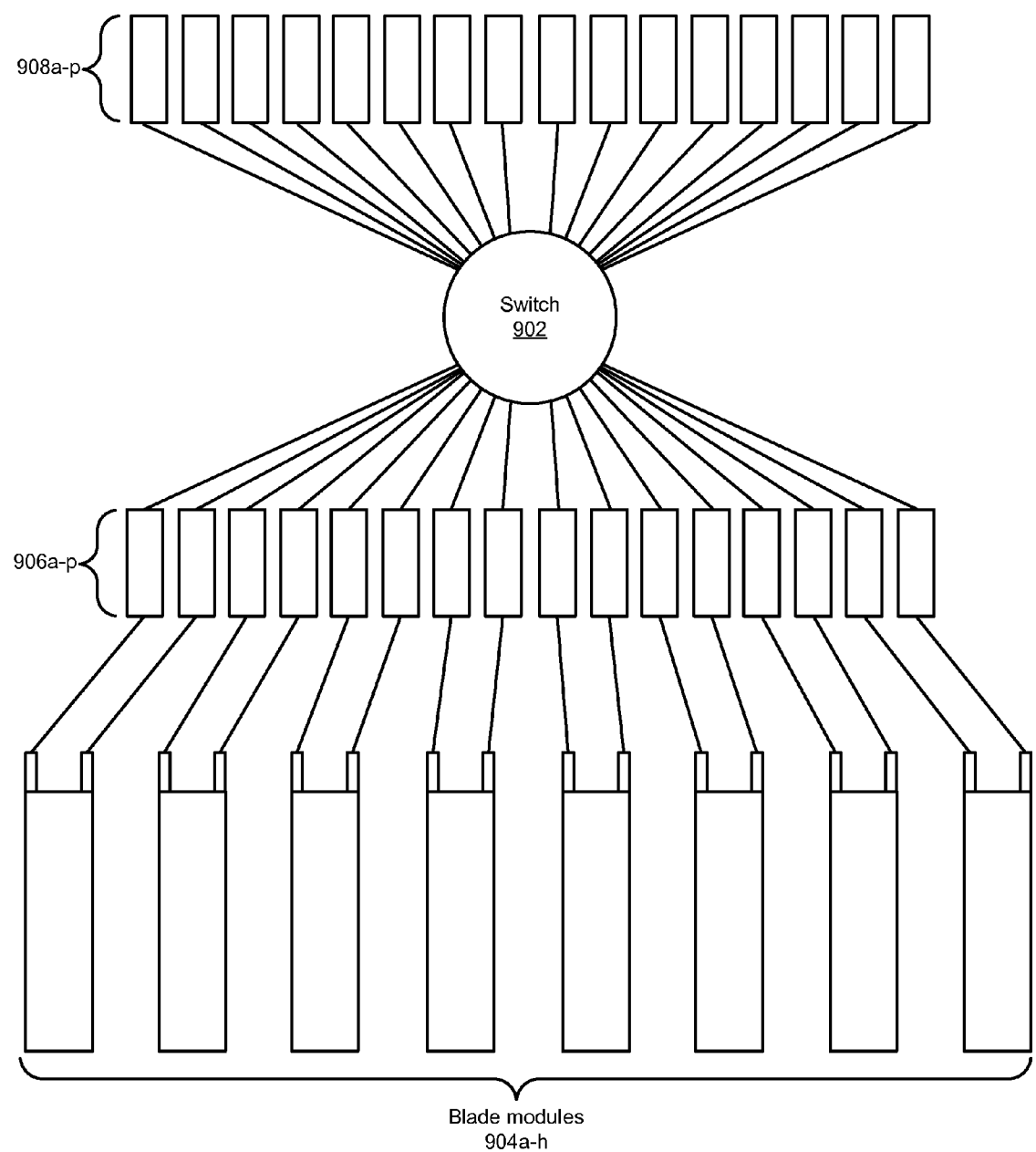
FIG. 9 is a schematic block diagram of a 3U single rail topology in accordance with the present invention.

FIG. 9 illustrates a schematic block diagram representing one connection topology for the a blade server system in accordance with the present invention. FIG. 9 illustrates a 3U single rail topology. Eight blade modules 904a-f each have two connectors. Each of the two connectors connects to one connector of a transition card, represented as the connection going into the elements 906a-p. In one embodiment, each blade module 904a-h connects to two transition cards, such as the transition cards 220a and 220b shown in FIG. 2. This connection may be made through the connectors 228a and 228b, also illustrated in FIG. 2.

The transition cards then connect to a blade aggregation module. As described above, the blade aggregation module may include a switch 902. This connection is represented by the connection of the elements 906a-p to the switch 902. Again referencing FIG. 2, this connection can be represented as the connection of the connectors 222a-f of the transition cards 220a to the first blade aggregation module 210.

In the depicted embodiment, the switch 902 then makes a connection to sixteen external ports 908a-p. This connection is shown in FIG. 2 as the communications connection between the first blade aggregation module 210 through the connectors 222a-f to the connectors 224a-f. These external ports 908a-p may in turn be connected to external computing devices to provide networked connection between the external devices and the blade modules 904a-h.

Those of skill in the art will appreciate that the depicted topology provides connectivity between each of the elements connected through the switch 902. As a result, each connected element, whether a blade module 904a-h or an external device connected to an external port 908a-p, has a communication path with every other device represented in FIG. 9.

Figure 10:
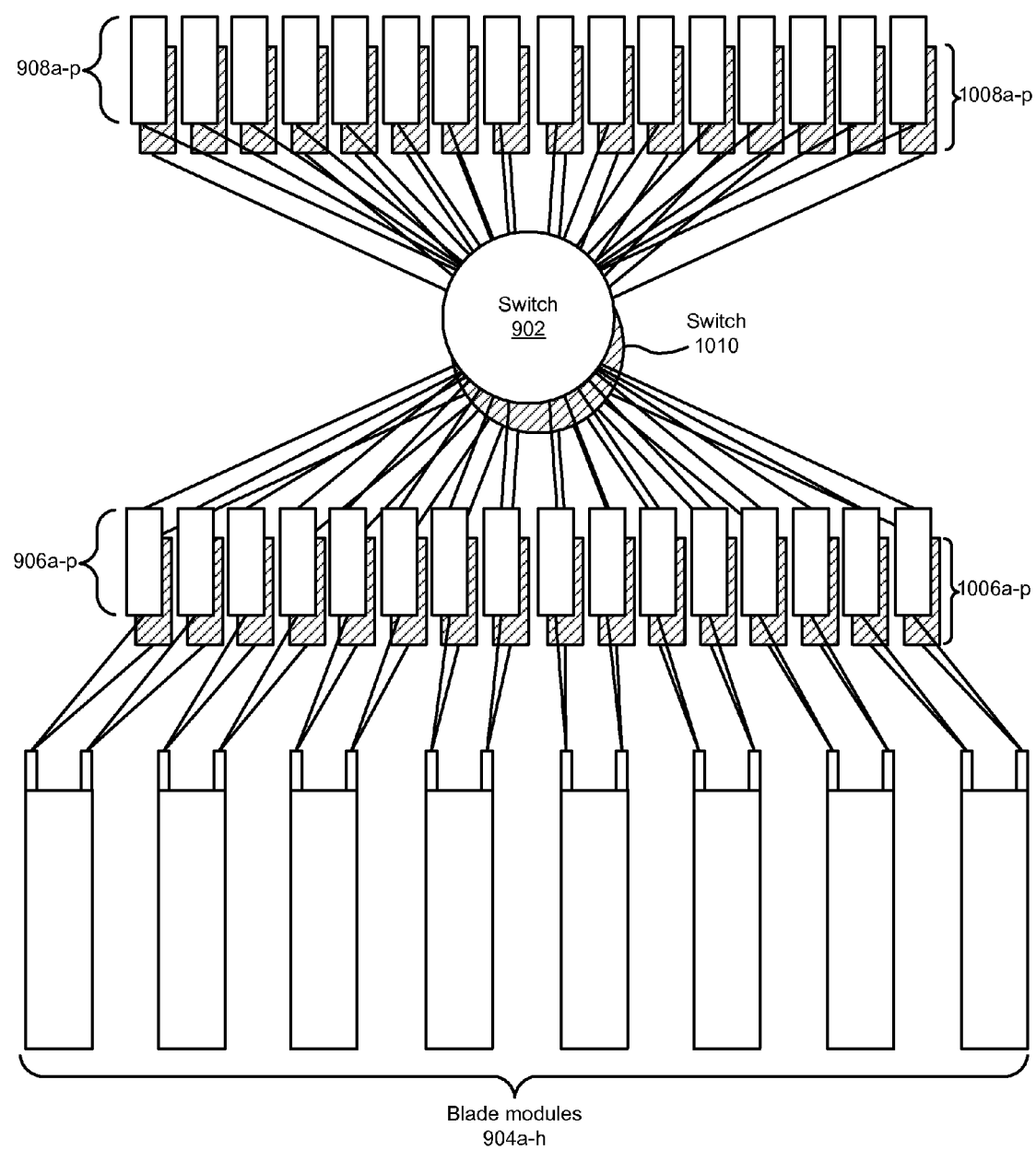
FIG. 10 is a schematic block diagram of a 3U dual rail topology in accordance with the present invention.

FIG. 10 is comparable to FIG. 9, but illustrates the connectivity with the addition of a second blade aggregation unit represented by the switch 1010. As such, FIG. 10 represents a 3U blade server system with a dual-rail topology. While the FIG. 10 appears quite complicated, it simply represents the same connections as those shown in FIG. 9, with the addition of redundant connections established by the connections 1006a-p, or the connection of the blade modules 904a-h to the second blade aggregation module represented by switch 1010. Such a topology provides redundant connectivity which ensures that all attached devices can communicate in the event that one of the switches 902 or 1010 fail. In addition, the additional communication paths increase the potential bandwidth of the blade server system.

Figure 11:
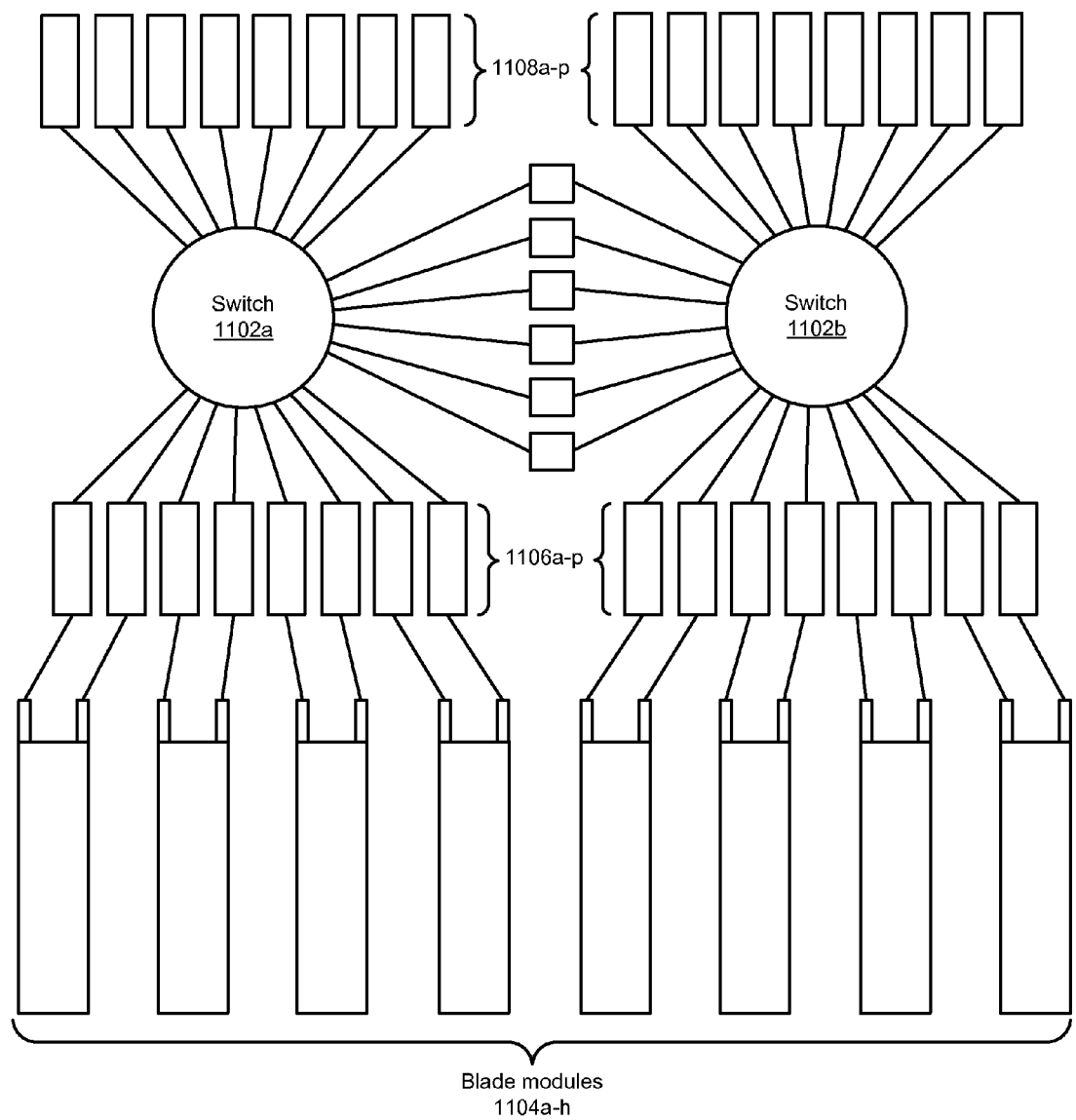
FIG. 11 is a second illustrative example of a 3U single rail topology having two switches in accordance with the present invention.

FIG. 11 illustrates a single-rail 3U topology in which a blade aggregation module, such as the blade aggregation module 210, is made up of two twenty-four port switches (with twenty-two active connections shown) 1102a and 1102b as opposed to a single thirty-six port switch 902 (which illustrated thirty-two connections). The blade modules 1104a-h connect to the transition cards, which connections are represented as going into 1106a-p, as before. However, the connections 1106a-p are split between the switch 1102a and 1102b. The switches 1102a and 1102b cross-connect and each connect to eight external connectors 1108a-p.

Those of skill in the art will appreciate that the same approach illustrated in FIG. 11 could be used with switches 1102a-b of a number of different sizes to change the input and output connection availability and numbers. It will further be appreciated that the connectivity system shown in FIG. 11 can be simply altered to present a 3U dual-rail topology comparable to that shown in FIG. 10.

Figure 12:
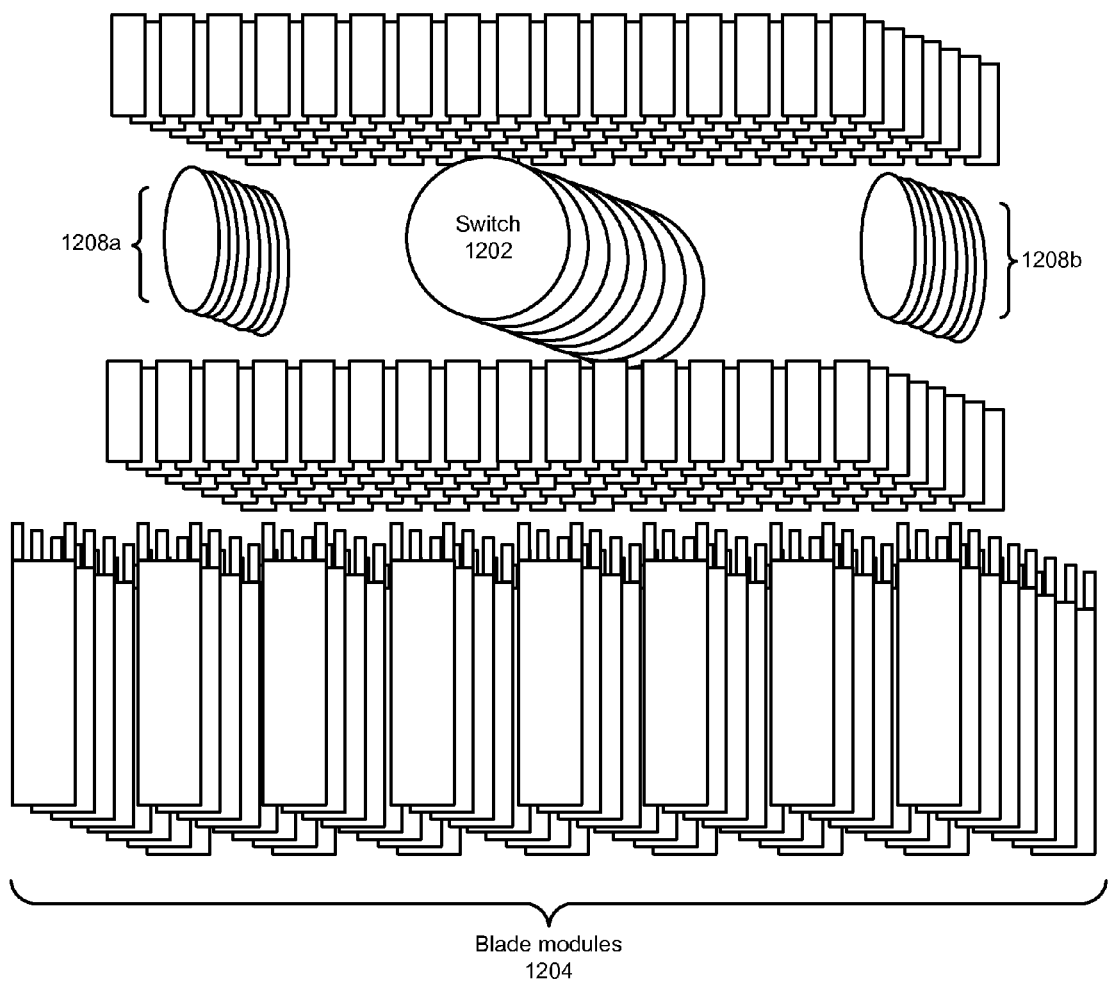
FIG. 12 is an illustrative example of a 20U topology in accordance with the present invention.

FIG. 12 is an illustration of a 20U system with sixty four blade modules 1204. The connections between devices in FIG. 12 have been omitted to make the figure more readable. The previous topology figures were for 3U system. As mentioned above, in one embodiment, a 3U row of connected blade modules 1204 is a bladed unit. Thus, the 20U unit topology illustrated in FIG. 12 may be understood as a stack of the previous topologies.

However, as discussed previously, a blade system comprising multiple bladed units requires connectivity between the various bladed units. This connectivity may be provided by the unit aggregation module. The connections component 1208a-b are provided by the unit aggregation modules which facilitate communications between any two devices connected to the blade server system represented by the topology in FIG. 12.

Those of skill in the art will appreciate that innumerable topologies can be created to fulfill different needs ranging from balanced bandwidth topologies, internal bandwidth topologies, switch topologies, and uplink switch topologies, and others. The present topologies are only illustrative of possible topologies configurable using the configurable, scalable, modular backplane of the present invention. The provisional application with application No. 60/873,111, which has been incorporated by reference, contains numerous topologies which may be implemented.

Those of skill in the art will further recognize that the backplane and blade system of the present invention may also be used to form multi-chassis systems. One example is a tree topology which has one or more leaf chassis containing blade modules, and a root chassis. The root chassis may contain no modules at all and simply be used as a large switch. Since, in a 20U chassis with sixty-four blade modules, all blade modules are interconnected through the two tiers of switching (provided by the blade aggregation module and unit aggregation module), the 20U chassis is essentially an extremely large leaf which, with one layer of external switching provided by the root chassis, can be aggregated into a tree of five-hundred and twelve 20U chassis comprising sixty-four modules each. Such a system can connect a tremendous amount of computing components and computer devices in comparatively little space. However, additional configurations may also be implemented, such as a multi-chassis mesh.

The highly configurable nature of the modular, composite, scalable backplane of the present invention allows a customer to implement a wide array of topologies with comparatively little pain and effort. In addition, the fact that the backplane may be reconfigured and added to according to need make the solution an extremely flexible one. A single system can be easily reconfigured to place an emphasis on redundancy, bandwidth, connectivity, or other areas of importance at a given time. In addition, the backplane incorporates many of the benefits of including active components without the severe impediments of a traditional backplane system.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed is:

1. A scalable, composite backplane for a server system, the backplane comprising:
   a first blade aggregation module configured to communicatively connect one or more computing devices connected to the first blade aggregation module;
   one or more transition cards, wherein one or more of the transition cards comprise:
      two or more connectors comprising:

a first card connector that connects to the first blade aggregation module;
one or more additional card connectors that connect to one or more computing devices; and
at least one communication connection between at least two of the connectors;
wherein at least one of the first blade aggregation module and the one or more transition cards comprise one or more active components; and
the first blade aggregation module connected to the first card connector of one or more of the transition cards, the union of a first transition card, the first blade aggregation module, and a second transition card defining an airflow passage permitting substantially unobstructed airflow through a portion of the scalable composite backplane.

2. The scalable, composite backplane of claim 1, wherein a computing device is one of a blade module, a unit aggregation module, a blade aggregation module, and one or more external computing devices.

3. The scalable, composite backplane of claim 2, wherein the one or more external computing devices comprise computing devices connected to an additional card connector through a network connection.

4. The scalable, composite backplane of claim 1, the blade aggregation module comprising one or more switches and two or more switch connectors communicatively connecting with the first card connectors of the one or more transition cards.

5. The scalable, composite backplane of claim 1, the two or more connectors providing a mechanical connection and a communication connection.

6. The scalable, composite backplane of claim 1, further comprising a second blade aggregation module, and wherein one of the one or more additional card connectors communicatively connects to the second blade aggregation module, the union of the first transition card, the first blade aggregation module, the second transition card, and the second blade aggregation module defining the airflow passage through a portion of the scalable composite backplane, and wherein at least one of the first blade aggregation module, the second blade aggregation module, and the one or more transition cards comprise one or more active components.

7. The scalable, composite backplane of claim 1, wherein the first blade aggregation module connected with one or more transition cards is a first unit, the scalable, composite backplane further comprising one or more additional units.

8. The scalable, composite backplane of claim 7, the one or more units communicatively connected through one or more unit aggregation modules, the one or more unit aggregation modules continuing the airflow passage along a longitudinal axis of the airflow passage, and wherein at least one of the blade aggregation modules, unit aggregation modules, and the one or more transition cards comprise one or more active components.

9. The scalable, composite backplane of claim 8, the one or more unit aggregation modules further comprising one or more external connectors communicatively connecting with one or more external computing devices.

10. The scalable, composite backplane of claim 1, further comprising a power distribution grid.

11. The scalable, composite backplane of claim 10, wherein the transition cards distribute power to one or more computing devices.

12. The scalable, composite backplane of claim 10, wherein the blade aggregation module distributes power to the one or more transition cards.

13. The scalable, composite backplane of claim 10, further comprising one or more baseboard management controllers (BMCs), the BMCs controlling power sequencing of the scalable, composite backplane.

14. The scalable, composite backplane of claim 13, wherein one or more blade modules comprising one or more BMCs are attached to the scalable, composite backplane, each blade aggregation module further comprising one or more BMCs, each unit aggregation module further comprising one or more BMCs.

15. The scalable, composite backplane of claim 13, further comprising a BMC master creating a power sequencing order, the one or more BMCs on each blade aggregation module, the one or more BMCs on each unit aggregation module, and the one or more BMCs on each blade module turning on power to the one or more computer components according to the power sequencing order.

16. The scalable, composite backplane of claim 13, further comprising a communications network and a management network, the one or more BMCs having communications access over the communications network and the management network.

17. The scalable, composite backplane of claim 1, one or more transition cards further comprising one or more active components, wherein the active components comprise at least one of a signal conditioning module providing one of signal regeneration, electrical-to-optical conversion, optical-to-electrical conversion, retiming, and signal restoration.

18. The scalable, composite backplane of claim 1, one or more transition cards further comprising one or more active components, and wherein at least one active component is a signal bridge module converting a signal from one communications protocol to a second communications protocol.

19. The scalable, composite backplane of claim 1, at least one transition card further comprising a switch.

20. A scalable, composite backplane system for a blade server, the system comprising:
one or more blade modules, each blade module comprising an interior airflow channel along the length of the blade module;
a first blade aggregation module configured to communicatively connect one or more connected computing devices;
one or more transition cards, wherein one or more of the transition cards comprise:
two or more connectors comprising:
a first card connector that connects to the first blade aggregation module;
one or more additional card connectors that connect to one or more computing devices; and
at least one communication connection between at least two of the connectors;
wherein at least one of the first blade aggregation module and the one or more transition cards comprise one or more active components; and
the first blade aggregation module connected to the first card connector of a first transition card and the first card connector of a second transition card, the union defining an airflow passage continuing the interior airflow channel of a first blade module, the airflow passage permitting substantially unobstructed airflow through the interior airflow channel of the first blade module and through the scalable composite backplane.

21. The system of claim 20, further comprising a chassis, the chassis comprising:
one or more power connectors that connect with a power source;

one or more power supplies generating one or more regulated direct current (DC) voltages;

one or more trays configured to support a row of blade modules; and one or more blade aggregation module supports providing structural support for one or more blade aggregation modules.

22. The system of claim 20, further comprising a second blade aggregation module, wherein one or more transition cards connect to the first blade aggregation module, the second blade aggregation module, and one or more blade modules, and wherein at least one of the first blade aggregation module, the second blade aggregation module, and the one or more transition cards comprise one or more active components.

23. The system of claim 20, wherein a first set of transition cards connects to one or more unit aggregation modules and a second set of transition cards connects to one or more external computing devices, and wherein at least one of the blade aggregation modules, the unit aggregation modules, and the one or more transition cards comprise one or more active components.

24. The system of claim 23, wherein one or more additional blade aggregation modules, the one or more blade modules, the one or more unit aggregation modules, and the one or more transition cards are hot-pluggable.

25. A scalable, modular backplane for a server system, the backplane comprising:

a first blade aggregation module comprising one or more switches;

a second blade aggregation module comprising one or more switches;

two or more transition cards, each transition card comprising a top connector that communicatively connects to the first blade aggregation module, a bottom connector that communicatively connects to the second blade aggregation module, a front connector that communicatively connects to a blade module, and a back connector that communicatively connects to one of a unit aggregation module and a network;

the first blade aggregation module connected to the top connector of the two or more transition cards, and the second blade aggregation module connected to the bottom connector of the two or more transition cards, wherein the two or more transition cards communicatively connected to the first blade aggregation module and second blade aggregation module are in parallel with the width of the first blade aggregation module and the second blade aggregation module; and wherein at least one of the first blade aggregation module, the second blade aggregation module, and the one or more transition cards comprise one or more active components; and one or more airflow passages allowing air flow through the scalable, modular backplane, wherein the airflow passages are the open areas between the first blade aggregation module joined to the two or more transition cards, the two or more transition cards further joined to the second blade aggregation module.

* * * * *